(12) United States Patent
Chen et al.

(10) Patent No.: US 10,630,319 B2
(45) Date of Patent: Apr. 21, 2020

(54) STRUCTURE OF INTERLEAVER WITH LDPC CODE

(71) Applicant: MediaTek Inc., Hsinchu (TW)

(72) Inventors: Ju-Ya Chen, Hsinchu (TW); Cheng-Yi Hsu, Hsinchu (TW); Yen-Shuo Chang, Hsinchu (TW); Wei-Jen Chen, Hsinchu (TW); Mao-Ching Chiu, Hsinchu (TW); Timothy Perrin Fisher-Jeffes, San Jose, CA (US); Chong-You Lee, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 93 days.

(21) Appl. No.: 15/878,357

(22) Filed: Jan. 23, 2018

(65) Prior Publication Data
US 2018/0212628 A1    Jul. 26, 2018

Related U.S. Application Data (60) Provisional application No. 62/449,677, filed on Jan. 24, 2017, provisional application No. 62/522,149, (Continued)

(51) Int. Cl.
*H03M 13/00* (2006.01)
*H04L 1/00* (2006.01)
(Continued)

(52) U.S. Cl.
CPC ... *H03M 13/2792* (2013.01); *H03M 13/1105* (2013.01); *H03M 13/116* (2013.01);
(Continued)

(58) Field of Classification Search
CPC .......... H03M 13/2792; H03M 13/1105; H03M 13/116; H03M 13/255; H03M 13/2707; H04L 1/0041; H04L 1/0058; H04L 1/0071
(Continued)

(56) References Cited

U.S. PATENT DOCUMENTS

| 7,756,048 | B2 | 7/2010 | Ahrens, Jr. et al. |
| 8,225,173 | B2 | 7/2012 | Shasha |

(Continued)

FOREIGN PATENT DOCUMENTS

| CN | 101119178 A | 2/2008 |
| CN | 101388743 A | 3/2009 |

(Continued)

OTHER PUBLICATIONS

State Intellectual Property Office, International Search Report and Written Opinion for International Patent Application No. PCT/CN2018/089624, dated Aug. 23, 2018.
(Continued)

*Primary Examiner* — Christine T. Tu
(74) *Attorney, Agent, or Firm* — Han IP PLLC; Andy M. Han (57) ABSTRACT

Concepts and schemes pertaining to structure of interleaver with low-density parity-check (LDPC) code are described. A processor of an apparatus encodes data to provide encoded data. A transceiver of the apparatus transmits the encoded data to at least one network node of a wireless network. In encoding the data to provide the encoded data, the processor encodes the data to result in each code block in the encoded data comprising a respective bit-level interleaver.

17 Claims, 5 Drawing Sheets

Related U.S. Application Data filed on Jun. 20, 2017, provisional application No. 62/544,115, filed on Aug. 11, 2017.

(51) Int. Cl.
*H03M 13/27* (2006.01)
*H03M 13/11* (2006.01)
*H03M 13/25* (2006.01)

(52) U.S. Cl.
CPC ..... *H03M 13/255* (2013.01); *H03M 13/2707* (2013.01); *H04L 1/0041* (2013.01); *H04L 1/0058* (2013.01); *H04L 1/0071* (2013.01)

(58) Field of Classification Search
USPC ....... 714/776, 780, 804, 800, 799, 746, 755, 714/756, 758, 763, 766, 701; 375/240.27, 375/242, 243
See application file for complete search history.

(56) References Cited

U.S. PATENT DOCUMENTS

| | | | |
|---|---|---|---|
| 8,473,817 B2 | 6/2013 | Shen et al. | |
| 8,510,358 B2 | 8/2013 | Yang et al. | |
| 8,689,088 B2 | 4/2014 | Lee et al. | |
| 9,094,841 B2 | 7/2015 | Sayana et al. | |
| 10,164,659 B2 | 12/2018 | Chiu et al. | |
| 10,298,268 B2 * | 5/2019 | Park ................. | H03M 13/2792 |
| 2004/0246893 A1 | 12/2004 | Ahrens, Jr. et al. | |
| 2007/0025548 A1 | 2/2007 | Zheng et al. | |
| 2007/0089027 A1 | 4/2007 | Lim et al. | |
| 2007/0211815 A1 | 9/2007 | Pan et al. | |
| 2008/0178065 A1 | 7/2008 | Khandekar et al. | |
| 2008/0276156 A1 | 11/2008 | Gunnam et al. | |
| 2008/0320353 A1 | 12/2008 | Blankenship et al. | |
| 2010/0257425 A1 | 10/2010 | Yue et al. | |
| 2012/0047415 A1 | 2/2012 | Djordjevic et al. | |
| 2012/0066563 A1 | 3/2012 | Obata et al. | |
| 2012/0084625 A1 | 4/2012 | Pisek et al. | |
| 2012/0089890 A1 * | 4/2012 | Palanki ................. | H04L 1/0007 714/776 |
| 2012/0257664 A1 | 10/2012 | Yue et al. | |
| 2015/0188734 A1 | 7/2015 | Petrov | |
| 2015/0311917 A1 | 10/2015 | Gunnam et al. | |
| 2016/0344502 A1 * | 11/2016 | Mouhouche ....... | H03M 13/1165 |
| 2017/0070377 A1 | 3/2017 | Sawahashi et al. | |
| 2017/0141798 A1 | 5/2017 | Kudekar et al. | |
| 2018/0139758 A1 | 5/2018 | Sankar et al. | |
| 2018/0246783 A1 | 8/2018 | Avraham et al. | |
| 2018/0294917 A1 | 10/2018 | Loncke et al. | |

FOREIGN PATENT DOCUMENTS

| | | | |
|---|---|---|---|
| CN | 101741527 A | 6/2010 | |
| CN | 101841390 A | 9/2010 | |
| CN | 101951264 A | 1/2011 | |
| CN | 102237978 A | 11/2011 | |
| CN | 101682486 B | 4/2013 | |
| CN | 103873186 A | 6/2014 | |
| CN | 104917588 A | 9/2015 | |
| CN | 105471547 A | 4/2016 | |
| CN | 106253912 A | 12/2016 | |
| CN | 102904583 B | 6/2017 | |
| EP | 1296490 A2 | 3/2003 | |
| EP | 1701450 A1 | 9/2006 | |
| EP | 2461511 A1 | 6/2012 | |
| EP | 2879297 A1 | 6/2015 | |
| TW | 200838159 A | 9/2008 | |

OTHER PUBLICATIONS

Mediatek Inc., Multi-codebook embedded compact QC-LDPC design, 3GPP TSG-RAN WG1 NR, Spokane, U.S.A., Aug. 3-7, 2017.

State Intellectual Property Office, International Search Report and Written Opinion for International Patent Application No. PCT/CN2018/093374, dated Sep. 26, 2018.

State Intellectual Property Office, International Search Report and Written Opinion for International Patent Application No. PCT/CN2018/093167, dated Sep. 25, 2018.

Toshihiko Okamura, A Hybrid ARQ Scheme Based on Shortened Low-Density Parity-Check Codes, Wireless Communications and Networking Conference, Mar. 31, 2008, pp. 82-87, XP031243605, ISBN: 978-1-4244-1997-5, WCNC, Piscataway, NJ, USA.

Jong-Ee Oh et al., Row-Splitting Design of Low-Density Parity-Check Codes for Gbps Transmission, Vehicular Technology Conference, Sep. 1, 2007, pp. 1127-1129, XP031147582, ISBN: 978-1-4244-0263-2.

Nokia et al., LDPC Design for eMBB, 3rd Generation Partnership Project, Aug. 12, 2016, pp. 20160822-20160826, vol. RAN WG1, Mobile Competence Center, Gothenburg, Sweden.

Hui Wang et al., On the LLR Criterion Based Shortening Design for LDPC Codes, 2016 Annual Conference on Information Science and Systems, Mar. 16, 2016, pp. 87-92.

European Patent Office, Partial European Search Report for Application No. 17170825.8-1906, dated Dec. 1, 2017.

Taiwan Intellectual Property Office, Office Action for Taiwan Patent Application No. 107102523, dated Jun. 24, 2019.

Taiwan Intellectual Property Office, Office Action for Taiwan Patent Application No. 107122449, dated Jun. 28, 2019.

State Intellectual Property Office, International Search Report and Written Opinion for PCT Patent Application No. PCT/CN2018/071868, dated Mar. 27, 2018.

Mediatek Inc., Implementation considerations on flexible and efficient LDPC decoders, Lisbon, Portugal, Oct. 10-14, 2016.

ZTE Corp., Consideration on LDPC codes for NR, Nanjing, China, May 23-27, 2016.

ZTE, Discussion on Channel Coding and Modulation for New Radio Interface, 3GPP TSG RAN WG1 #84bis, R1-162229, Apr. 15, 2016, Korea.

State Intellectual Property Office, International Search Report and Written Opinion for PCT Patent Application No. PCT/CN2018/073962, dated Apr. 20, 2018.

State Intellectual Property Office, International Search Report and Written Opinion for International Patent Application No. PCT/CN2018/073963, dated May 2, 2018.

Taiwan Intellectual Property Office, Office Action for Taiwan Patent Application No. 106129096, dated Dec. 17, 2018.

USPTO, Office Action for U.S. Appl. No. 15/995,093, darted Sep. 17, 2019.

Taiwan Intellectual Property Office, Office Action for Taiwan Patent Application No. 107102522, dated Oct. 17, 2019.

Taiwan Intellectual Property Office, Office Action for Taiwan Patent Application No. 107122310 dated Jul. 24, 2019.

Taiwan Intellectual Property Office, Office Action for Taiwan Patent Application No. 107118939, dated Dec. 11, 2019.

European Patent Office, Extended European Search Report for European Patent Application No. 18736710.7, dated Jan. 7, 2020.

* cited by examiner

STRUCTURE OF INTERLEAVER WITH LDPC CODE

CROSS REFERENCE TO RELATED PATENT APPLICATIONS

The present disclosure claims the priority benefit of U.S. Provisional Patent Application Ser. Nos. 62/449,677, 62/522,149 and 62/544,115, filed 24 Jan. 2017, 20 Jun. 2017 and 11 Aug. 2017, respectively, contents of which are herein incorporated by reference in their entirety.

TECHNICAL FIELD

The present disclosure is generally related to information coding and, more particularly, to structure of interleaver with low-density parity-check (LDPC) code.

BACKGROUND

Unless otherwise indicated herein, approaches described in this section are not prior art to the claims listed below and are not admitted as prior art by inclusion in this section.

In $5^{th}$-generation (5G) New Radio (NR) mobile communications, LDPC is used in NR data channel. In general, LDPC is composed of a base matrix and shift-coefficient tables. In the base matrix, weights of the columns of the matrix may be different from one another, and the column weight of a column is typically the total number of "1" in that column of the base matrix. Usually the larger the column weight the strength of encryption is stronger. Put differently, the smaller the column weight the greater sensitivity (or susceptibility) to noise (e.g., burst interference) there is.

Most parity variable node blocks are constructed by diagonal extension which results in the column weight of 1. For instance, each extended parity block has a variable degree of one. The diagonal extended parity blocks and information blocks can have different sensitivities to burst interference. Moreover, different bits in high-order modulation have different reliabilities.

SUMMARY

The following summary is illustrative only and is not intended to be limiting in any way. That is, the following summary is provided to introduce concepts, highlights, benefits and advantages of the novel and non-obvious techniques described herein. Select implementations are further described below in the detailed description. Thus, the following summary is not intended to identify essential features of the claimed subject matter, nor is it intended for use in determining the scope of the claimed subject matter.

An objective of the present disclosure is to propose various novel concepts and schemes pertaining to structure of interleaver with LDPC code, which can be implemented in next-generation communications, whether wired or wireless, including 5G NR wireless communications. More specifically, under a proposed scheme of the present disclosure, each transmission of each code block may include a bit-level interleaver.

In one aspect, a method may involve a processor of an apparatus encoding data to provide encoded data. The method may also involve the processor transmitting the encoded data to a network node of a wireless network. In encoding the data to provide the encoded data, the processor may encode the data to result in each code block in the encoded data comprising a respective bit-level interleaver.

In one aspect, an apparatus may include a transceiver and a processor coupled to the transceiver. The transceiver may be capable of wireless communications with at least one network node of a wireless network. The processor may be capable of encoding data to provide encoded data. The transceiver may be capable of transmitting the encoded data to the at least one network node of the wireless network. In encoding the data to provide the encoded data, the processor may encode the data to result in each code block in the encoded data comprising a respective bit-level interleaver.

It is noteworthy that, although description of the proposed scheme and various examples is provided below in the context of 5G NR wireless communications, the proposed concepts, schemes and any variation(s)/derivative(s) thereof may be implemented in communications in accordance with other protocols, standards and specifications where implementation is suitable. Thus, the scope of the proposed scheme is not limited to the description provided herein.

BRIEF DESCRIPTION OF THE DRAWINGS

The accompanying drawings are included to provide a further understanding of the disclosure, and are incorporated in and constitute a part of the present disclosure. The drawings illustrate implementations of the disclosure and, together with the description, serve to explain the principles of the disclosure. It is appreciable that the drawings are not necessarily in scale as some components may be shown to be out of proportion than the size in actual implementation in order to clearly illustrate the concept of the present disclosure.

DETAILED DESCRIPTION OF PREFERRED IMPLEMENTATIONS

Detailed embodiments and implementations of the claimed subject matters are disclosed herein. However, it shall be understood that the disclosed embodiments and implementations are merely illustrative of the claimed subject matters which may be embodied in various forms. The present disclosure may, however, be embodied in many different forms and should not be construed as limited to the exemplary embodiments and implementations set forth herein. Rather, these exemplary embodiments and implementations are provided so that description of the present disclosure is thorough and complete and will fully convey the scope of the present disclosure to those skilled in the art. In the description below, details of well-known features and techniques may be omitted to avoid unnecessarily obscuring the presented embodiments and implementations.

Overview

Under the proposed concepts and schemes in accordance with the present disclosure, modulation bits with higher reliability may be mapped to LDPC bit locations with higher column weight to provide more protection. As systematic bits and/or information bits in LDPC tend to be related to higher column weights, modulation bits with higher reliability may be mapped to systematic bits, for example. Thus, an interleaver may be formed by mapping modulation bits with higher reliability first to locations of LDPC systematic bits and then to locations of parity bits.

Figure 1:
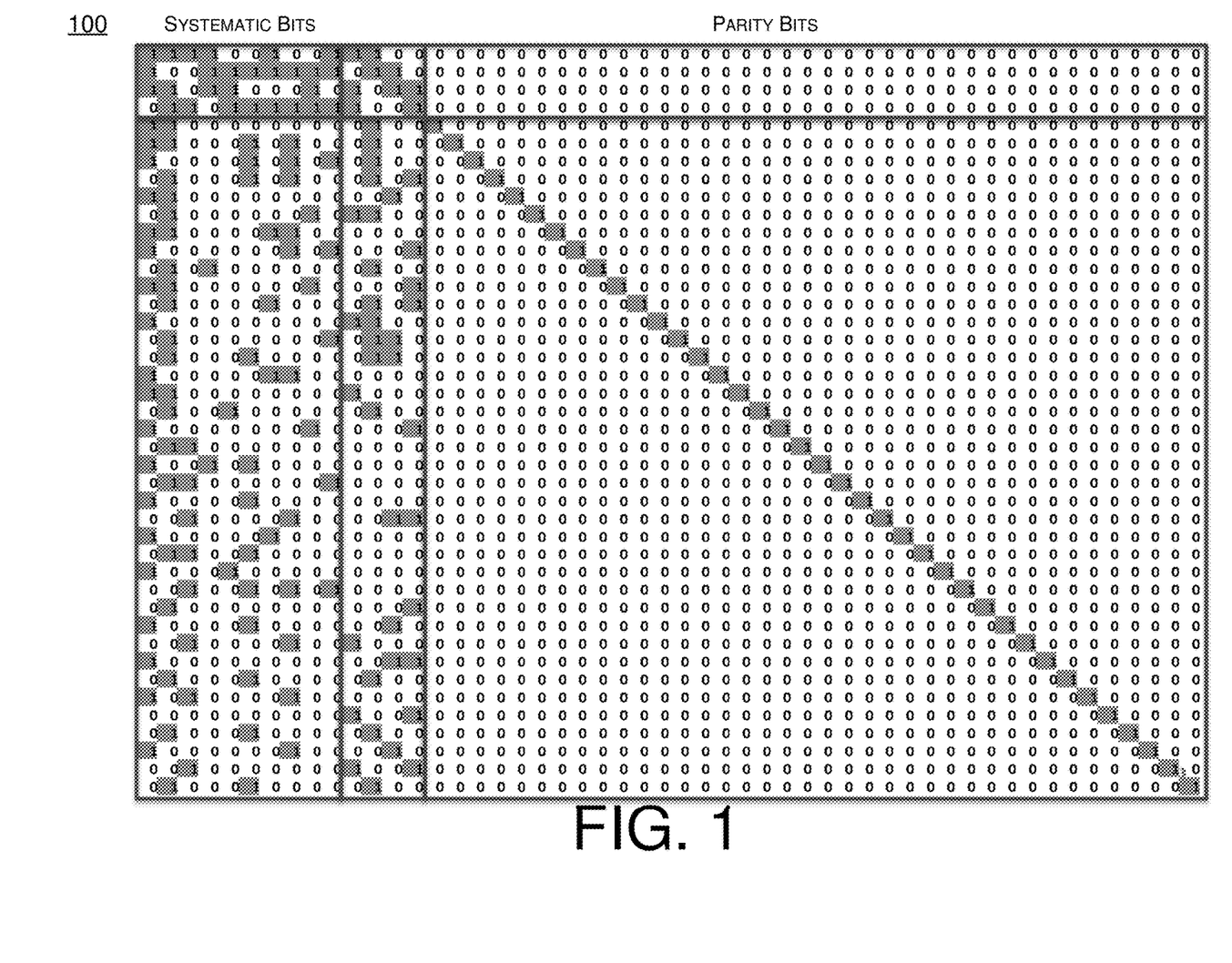
FIG. 1 is a diagram of an example base matrix for LDPC code in accordance with an implementation of the present disclosure.

FIG. 1 illustrates an example base matrix 100 for LDPC code in accordance with an implementation of the present disclosure. As mentioned above, under the proposed concepts and schemes in accordance with the present disclosure, modulation bits with higher reliability may be mapped first to locations of systematic bits, located in several columns on the left side of base matrix 100, and then to locations of parity bits, located in majority of the columns on the right side of base matrix 100.

Figure 2:
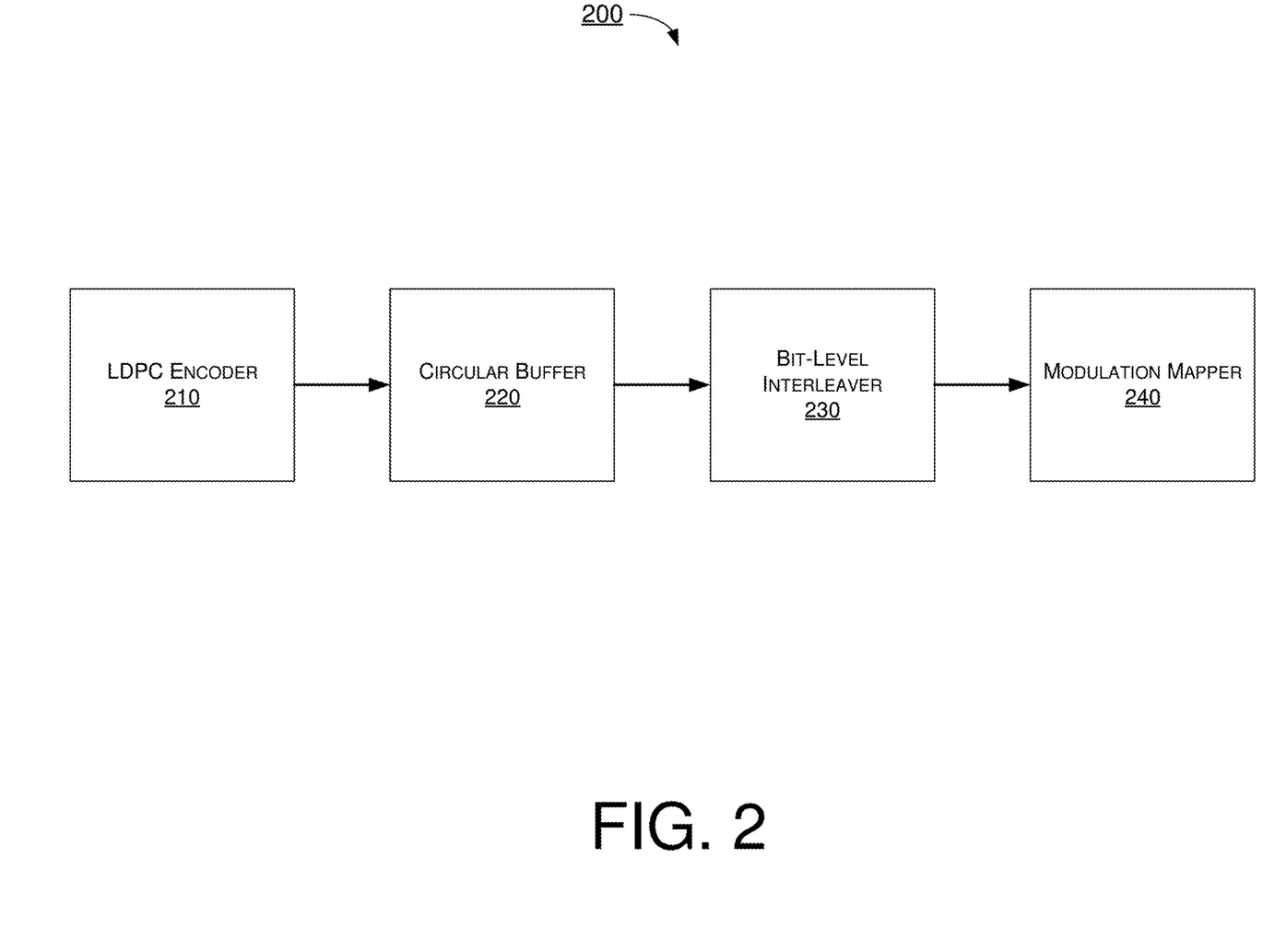
FIG. 2 is a diagram of an example architecture of LDPC code with interleaver in accordance with an implementation of the present disclosure.

FIG. 2 illustrates an example architecture 200 of LDPC code with interleaver in accordance with an implementation of the present disclosure. Referring to FIG. 2, architecture 200 may include a LPDC encoder 210, a circular buffer 220, a bit-level interleaver 230 and a modulation mapper 240. LDPC encoder 210 may be configured, designed or otherwise adapted to perform LDPC encoding on input data to provide a stream of encoded data. Circular buffer 220 may be configured, designed or otherwise adapted to receive the stream of encoded data from LDPC encoder 210 and buffer the stream of encoded data. Bit-level interleaver 230 may be configured, designed or otherwise adapted to receive the stream of encoded data from circular buffer 220 and perform bit-level interleaving on the encoded data to provide a stream of interleaved data (e.g., including systematic bits, information bits and parity bits). Accordingly, data may be rate matched and then passed through bit-level interleaver 230. Since the data may be rate matched with a suitable code rate (e.g., a relatively higher code rate), a decoder at a receiver may utilize the corresponding code rate to decode received data. Advantageously, complexity of the decoder with encoder architecture 200 may be lower than that of the decoder with encoder architecture 100. Modulation mapper 240 may be configured, designed or otherwise adapted to receive the stream of interleaved data from bit-level interleaver 230 and map modulation bits in the stream of interleaved data to base matrix 100 as described above. That is, modulation mapper 240 may be configured, designed or otherwise adapted to map modulation bits with higher reliability first to locations of LDPC systematic bits and then to locations of parity bits in base matrix 100.

Under the proposed concepts and schemes in accordance with the present disclosure, the interleaver may be a block interleaver. In particular, a number of rows of the interleaver may be the same as the modulation order. Moreover, a number of columns of the interleaver may be the same as ceil, which is the smallest integer greater than a result of dividing a codeword length by the modulation order. In an event that a codeword length is an integer multiple of the modulation order, the number of columns of the interleaver may be equal to the codeword length divided by the modulation order (e.g., number of columns=codeword length/modulation order). The interleaver in accordance with the present disclosure may write data row by row (e.g., row-wise write), and may read data column by column (e.g., column-wise read). Accordingly, this may achieve systematic bit priority ordering for redundancy version 0 (RV0).

Moreover, the bits of each column may constitute a respective modulation symbol. In other words, bits a1 to aJ (where J denotes the modulation order) may form a modulation symbol. Furthermore, the number of coded bits in a code block may be an integer multiple of the modulation order.

Figure 3:
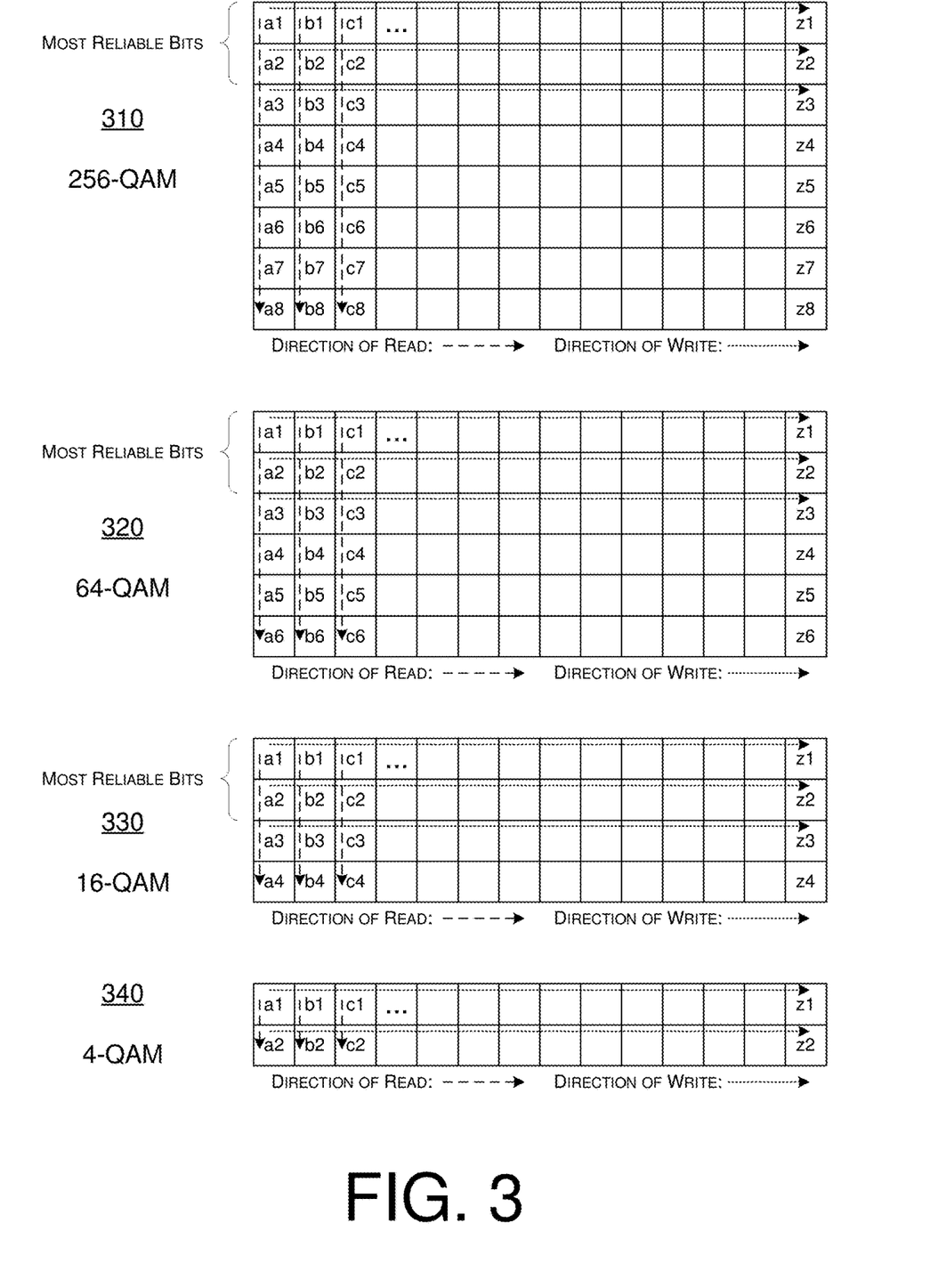
FIG. 3 is a diagram of various example interleavers in accordance with an implementation of the present disclosure.

FIG. 3 illustrates example interleavers 310, 320, 330 and 340 in accordance with an implementation of the present disclosure. Referring to FIG. 3, each of interleavers 310, 320, 330 and 340 may be a block interleaver. Interleaver 310 may be an interleaver for 256-quadrature amplitude modulation (QAM). For 256-QAM, the modulation order is 8 as $256=2^8$, and thus the number of rows in interleaver 310 may be eight. Interleaver 320 may be an interleaver for 64-QAM. For 64-QAM, the modulation order is 6 as $64=2^6$, and thus the number of rows in interleaver 320 may be six. Interleaver 330 may be an interleaver for 16-QAM. For 16-QAM, the modulation order is 4 as $16=2^4$, and thus the number of rows in interleaver 330 may be four. Interleaver 340 may be an interleaver for 4-QAM. For 4-QAM, the modulation order is 2 as $4=2^2$, and thus the number of rows in interleaver 340 may be two.

In interleaver 310, as there are eight rows, each modulation symbol includes eight bits (e.g., a first modulation symbol containing bits a1~a8, a second modulation symbol containing bits b1~b8, a third modulation symbol containing bits c1~c8, and so on). In interleaver 320, as there are six rows, each modulation symbol includes six bits (e.g., a first modulation symbol containing bits a1~a6, a second modulation symbol containing bits b1~b6, a third modulation symbol containing bits c1~c6, and so on). In interleaver 330, as there are four rows, each modulation symbol includes four bits (e.g., a first modulation symbol containing bits a1~a4, a second modulation symbol containing bits b1~b4, a third modulation symbol containing bits c1~c4, and so on). In interleaver 340, as there are two rows, each modulation symbol includes two bits (e.g., a first modulation symbol containing bits a1 and a2, a second modulation symbol containing bits b1 and b2, a third modulation symbol containing bits c1 and c2, and so on).

With respect to QAM constellation, the first two bits have higher log likelihood ratio (LLR), or reliability, and the last two bits have lower LLR or reliability. Accordingly, 4-QAM, or quadrature phase-shift keying (QPSK), has one reliability level, 16-QAM has two reliability levels, 64-QAM has three reliability levels, and 256-QAM has four reliability levels.

Under the proposed concepts and schemes in accordance with the present disclosure, the first two bits are most reliable bits in a given modulation symbol with gray coding. The systematic bits of LDPC may be filled in the first row first and then in the second row. That is, bits with higher reliability in a modulation symbol may be allocated or otherwise mapped to locations of LDPC systematic bits.

Illustrative Implementations

Figure 4:
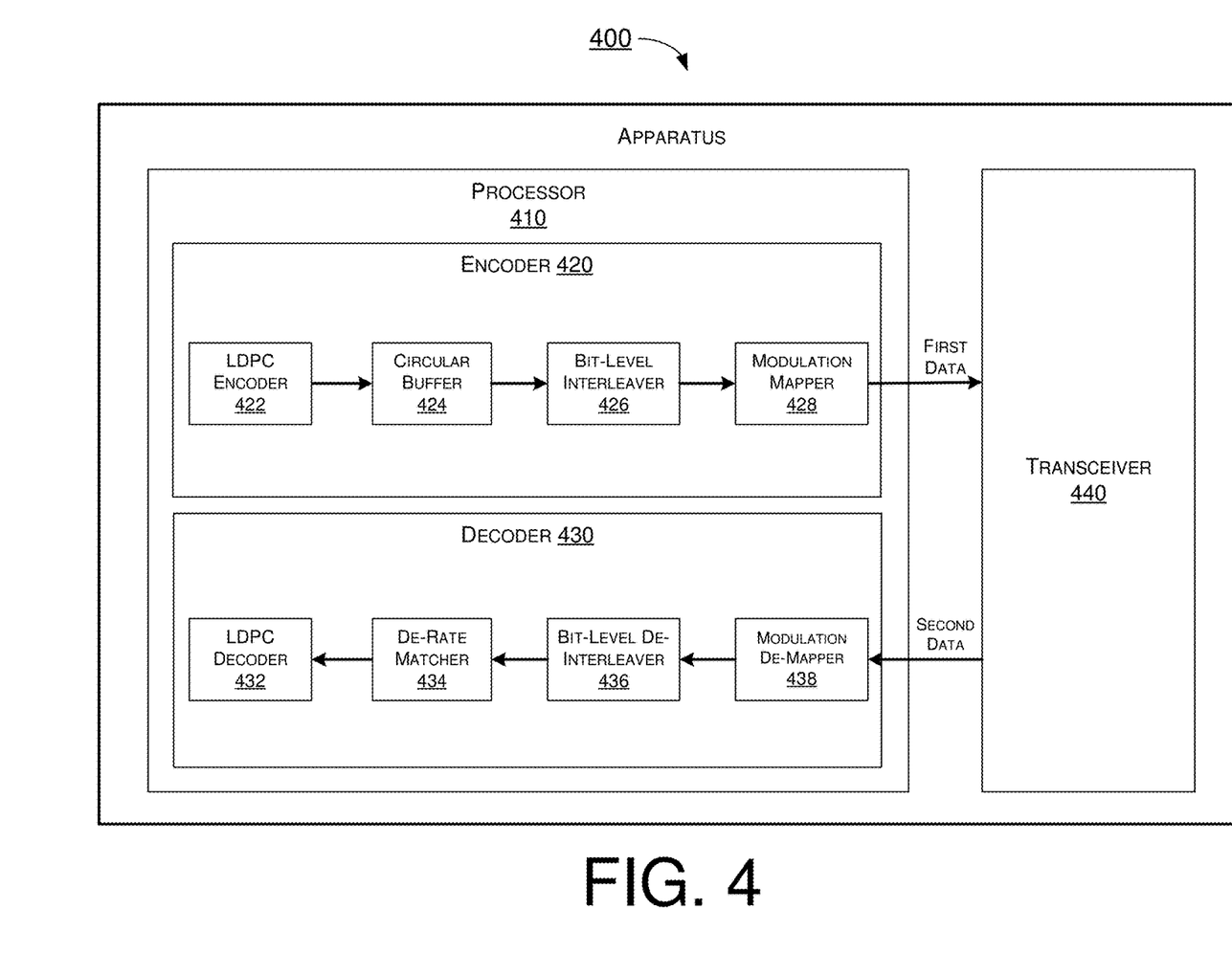
FIG. 4 is a block diagram of an example apparatus in accordance with an implementation of the present disclosure.

FIG. 4 illustrates an example apparatus 400 in accordance with an implementation of the present disclosure. Apparatus 400 may perform various functions as a communication device to implement concepts, schemes, techniques, processes and methods described herein pertaining to structure of interleaver with LDPC code, including those described above with respect to FIG. 1~FIG. 3 as well as process 500 described below.

Apparatus 400 may be a part of an electronic apparatus which may be a communication device, a computing apparatus, a portable or mobile apparatus, or a wearable apparatus. For instance, apparatus 400 may be implemented in a user equipment, a base station, a smartphone, a smartwatch, a smart bracelet, a smart necklace, a personal digital assistant, or a computing device such as a tablet computer, a laptop computer, a notebook computer, a desktop computer, or a server. Alternatively, apparatus 400 may be implemented in the form of one or more integrated-circuit (IC) chips such as, for example and not limited to, one or more single-core processors, one or more multi-core processors, or one or more complex-instruction-set-computing (CISC) processors.

Apparatus 400 may include at least some of those components shown in FIG. 4. For instance, apparatus 400 may include at least a processor 410. Additionally, apparatus 400 may include a transceiver 440 configured to engage in wireless communications by transmitting and receiving data wirelessly with at least one network node of a wireless network (e.g., in compliance with one or more 4GPP and 5G NR stands, protocols, specifications and/or any applicable wireless protocols and standards). Apparatus 400 may further include other components (e.g., memory, power system, display device and user interface device), which are not pertinent to the proposed scheme of the present disclosure and, thus, are neither shown in FIG. 4 nor described herein in the interest of simplicity and brevity.

In one aspect, processor 410 may be implemented in the form of one or more single-core processors, one or more multi-core processors, or one or more CISC processors. That is, even though a singular term "a processor" is used herein to refer to processor 410, processor 410 may include multiple processors in some implementations and a single processor in other implementations in accordance with the present disclosure. In another aspect, processor 410 may be implemented in the form of hardware (and, optionally, firmware) with electronic components including, for example and without limitation, one or more transistors, one or more diodes, one or more capacitors, one or more resistors, one or more inductors, one or more memristors and/or one or more varactors that are configured and arranged to achieve specific purposes in accordance with the present disclosure. In other words, in at least some implementations, processor 410 is a special-purpose machine specifically designed, arranged and configured to perform specific tasks including structure of interleaver with LDPC code in accordance with various implementations of the present disclosure.

Processor 410, as a special-purpose machine, may include non-generic and specially-designed hardware circuits that are designed, arranged and configured to perform specific tasks pertaining to structure of interleaver with LDPC code in accordance with various implementations of the present disclosure. In one aspect, processor 410 may execute the one or more sets of codes, programs and/or instructions (e.g., stored in memory accessible by processor 410) to perform various operations to render structure of interleaver with LDPC code in accordance with various implementations of the present disclosure. In another aspect, processor 410 may include an encoder 420 and a decoder 430 that, together, perform specific tasks and functions to render structure of interleaver with LDPC code in accordance with various implementations of the present disclosure. In some implementations, concepts, schemes, techniques, processes and methods with respect to structure of interleaver with LDPC code, including those described above with respect to FIG. 1~FIG. 3, may be implemented in or by encoder 420 as well as decoder 430. Each of encoder 420 and decoder 430 may be implemented in the form of hardware with electronic circuitry. Alternatively, each of encoder 420 and decoder 430 may be implemented in the form of software. Still alternatively, each of encoder 420 and decoder 430 may be implemented in the form of a combination of hardware and software.

In some implementations, encoder 420 may include a LDPC encoder 422, a circular buffer 424, a bit-level interleaver 426 and a modulation mapper 428. Encoder 420 may be capable of encoding data to provide encoded data as first data. That is, encoder 420 may be an example implementation of architecture 200, and LDPC encoder 422, circular buffer 424, bit-level interleaver 426 and modulation mapper 428 may be example implementations of LDPC encoder 210, circular buffer 220, bit-level interleaver 230 and modulation mapper 240, respectively. Thus, LDPC encoder 422 may be configured, designed or otherwise adapted to perform LDPC encoding on input data to provide a stream of encoded data. Circular buffer 424 may be configured, designed or otherwise adapted to receive the stream of encoded data from LDPC encoder 422 and buffer the stream of encoded data. Bit-level interleaver 426 may be configured, designed or otherwise adapted to receive the stream of encoded data from circular buffer 424 and perform bit-level interleaving on the encoded data to provide a stream of interleaved data (e.g., including systematic bits, information bits and parity bits). Modulation mapper 428 may be configured, designed or otherwise adapted to receive the stream of interleaved data from bit-level interleaver 426 and map modulation bits in the stream of interleaved data to a base matrix (e.g., base matrix 100) as described above. That is, modulation mapper 428 may be configured, designed or otherwise adapted to map modulation bits with higher reliability first to locations of LDPC systematic bits and then to locations of parity bits in the base matrix.

In some implementations, decoder 430 may include a LDPC decoder 432, a de-rate matcher 434, a bit-level de-interleaver 436 and a modulation de-mapper 438. Decoder 430 may be capable of decoding second data, as encoded data received from transceiver 440, to provide decoded data. Modulation de-mapper 438 may perform modulation de-mapping on second data to provide de-mapped data to bit-level de-interleaver 436. Bit-level de-interleaver 436 may de-interleave the de-mapped data to provide de-interleaved data to de-rate matcher 434. De-rate matcher 434 may perform de-rate matching on the de-interleaved data to provide de-rate matched data to LDPC decoder 432. LDPC decoder 432 may perform LDPC decoding on the de-rate matched data to provide decoded data.

Illustrative Processes

Figure 5:
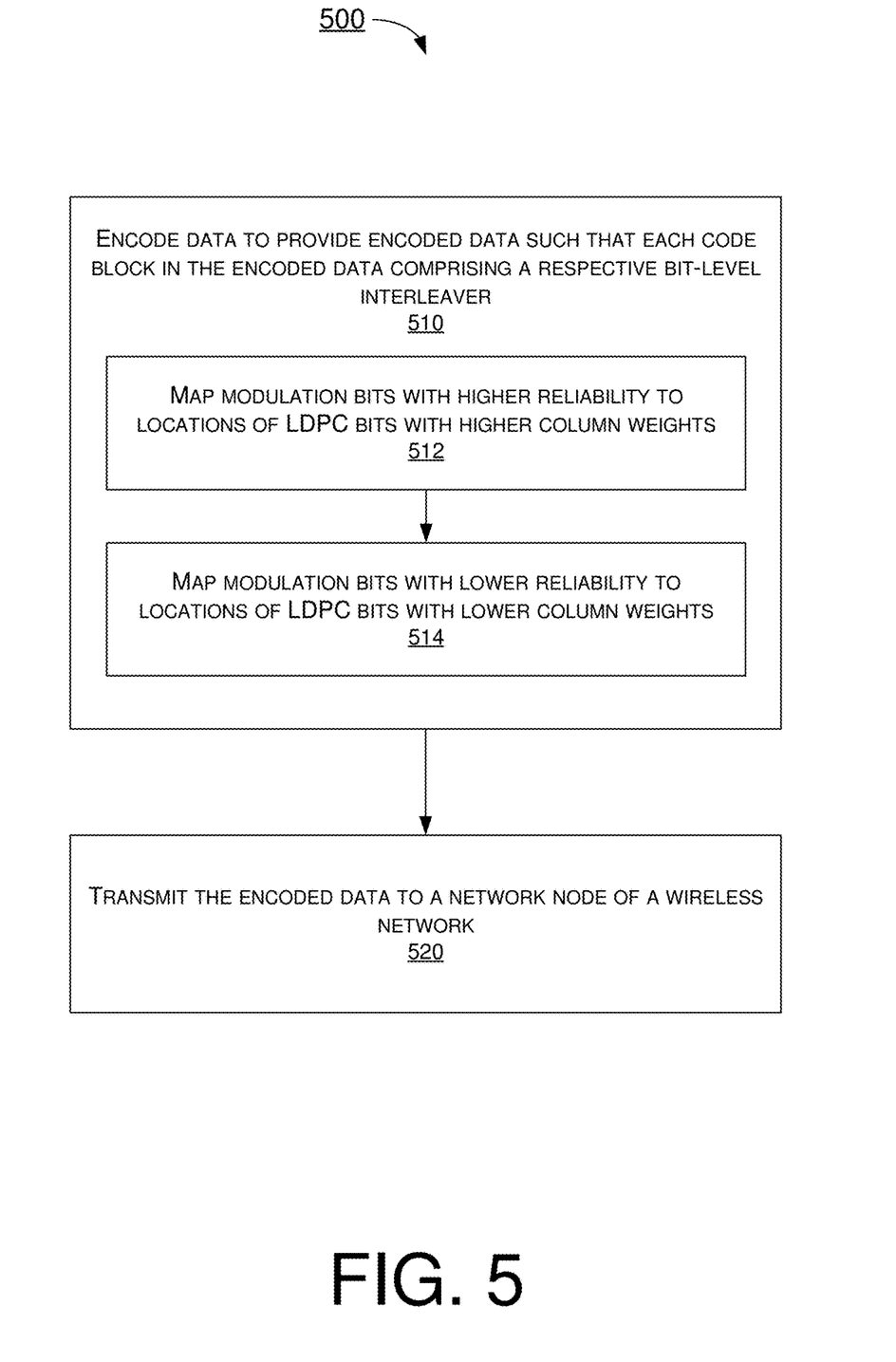
FIG. 5 is a flowchart of an example process in accordance with an implementation of the present disclosure.

FIG. 5 illustrates an example process 500 in accordance with an implementation of the present disclosure. Process 500 may represent an aspect of implementing the proposed concepts and schemes such as those described with respect to FIG. 1~FIG. 3. More specifically, process 500 may represent an aspect of the proposed concepts and schemes pertaining to structure of interleaver with LDPC code. Process 500 may include one or more operations, actions, or functions as illustrated by one or more of blocks 510 and 520 as well as sub-blocks 512 and 514. Although illustrated as discrete blocks, various blocks of process 500 may be divided into additional blocks, combined into fewer blocks, or eliminated, depending on the desired implementation. Moreover, the blocks/sub-blocks of process 500 may be executed in the order shown in FIG. 5 or, alternatively in a different order. Process 500 may be implemented by apparatus 400 and any variations thereof. For instance, process 500 may be implemented in or by apparatus 400. Solely for illustrative purposes and without limiting the scope, process 500 is described below in the context of apparatus 400. Process 500 may begin at block 510.

At 510, process 500 may involve processor 410 of apparatus 400 encoding data to provide encoded data. In encoding the data to provide the encoded data, process 500 may involve processor 410 encoding the data to result in each code block in the encoded data comprising a respective bit-level interleaver. Process 500 may proceed from 510 to 520.

At 520, process 500 may involve processor 410 of apparatus 400 transmitting, via transceiver 440, the encoded data to a network node of a wireless network.

With respect to encoding the data to provide the encoded data, process 500 may involve processor 410 performing a number of operations as represented by sub-blocks 512 and 514.

At 512, process 500 may involve processor 410 mapping modulation bits with higher reliability to locations of LDPC bits with higher column weights. Process 500 may proceed from 512 to 514.

At 514, process 500 may involve processor 410 mapping modulation bits with lower reliability to locations of LDPC bits with lower column weights.

In some implementations, the LDPC bits with higher column weights may include systematic bits, information bits, or a combination thereof.

In some implementations, in encoding the data, process 500 may involve processor 410 mapping modulation bits with higher reliability to locations of LDPC systematic bits first before mapping to locations of parity bits.

In some implementations, the respective bit-level interleaver in each code block may include a block interleaver. In some implementations, the block interleaver may include a 256-QAM interleaver, a 64-QAM interleaver, a 16-QAM interleaver or a 4-QAM interleaver.

In some implementations, a number of rows in the block interleaver may equal a modulation order of the block interleaver.

In some implementations, a number of columns in the block interleaver may equal either a result of dividing a codeword length by the modulation order, in an event that the codeword length is an integer multiple of the modulation order, or a smallest integer greater than the result of dividing the codeword length by the modulation order, in an event that the codeword length is not an integer multiple of the modulation order.

In some implementations, the block interleaver may write data row by row and may read the data column by column.

In some implementations, bits in each column of the block interleaver may form a respective modulation symbol.

In some implementations, first two bits in each modulation symbol may be more reliable than other bits in the respective modulation symbol with gray coding.

In some implementations, in encoding the data, process 500 may involve processor 410 filling systematic bits of LDPC coding first in a first row of the block interleaver and then in a second row of the block interleaver.

Additional Notes

The herein-described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

Further, with respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

Moreover, it will be understood by those skilled in the art that, in general, terms used herein, and especially in the appended claims, e.g., bodies of the appended claims, are generally intended as "open" terms, e.g., the term "including" should be interpreted as "including but not limited to," the term "having" should be interpreted as "having at least," the term "includes" should be interpreted as "includes but is not limited to," etc. It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to implementations containing only one such recitation, even when the same claim includes the introductory phrases "one or more" or "at least one" and indefinite articles such as "a" or "an," e.g., "a" and/or "an" should be interpreted to mean "at least one" or "one or more;" the same holds true for the use of definite articles used to introduce claim recitations. In addition, even if a specific number of an introduced claim recitation is explicitly recited, those skilled in the art will recognize that such recitation should be interpreted to mean at least the recited number, e.g., the bare recitation of "two recitations," without other modifiers, means at least two recitations, or two or more recitations. Furthermore, in those instances where a convention analogous to "at least one of A, B, and C, etc." is used, in general such a construction is intended in the sense one having skill in the art would understand the convention, e.g., "a system having at least one of A, B, and C" would include but not be limited to systems that have A alone, B alone, C alone, A and B together, A and C together, B and C together, and/or A, B, and C together, etc. In those instances where a convention analogous to "at least one of A, B, or C, etc." is used, in general such a construction is intended in the sense one having skill in the art would understand the convention, e.g., "a system having at least one of A, B, or C" would include but not be limited to systems that have A alone, B alone, C alone, A and B together, A and C together, B and C together, and/or A, B, and C together, etc. It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

From the foregoing, it will be appreciated that various implementations of the present disclosure have been described herein for purposes of illustration, and that various modifications may be made without departing from the scope and spirit of the present disclosure. Accordingly, the various implementations disclosed herein are not intended to be limiting, with the true scope and spirit being indicated by the following claims.

What is claimed is:

1. A method, comprising:
    encoding, by a processor of an apparatus, data with a low-density parity-check (LDPC) code to provide encoded data, the encoding comprising interleaving, by a bit-level interleaver in the processor, the data to provide a stream of interleaved data; and
    transmitting, by the processor, the encoded data to a network node of a wireless network,
    wherein the encoding of the data to provide the encoded data comprises encoding the data to result in a code block in the encoded data being used in the bit-level interleaver;
    wherein a base matrix of the LDPC code comprises a plurality of LDPC bits arranged in a plurality of rows and a plurality of columns,
    wherein the bit-level interleaver comprises a block interleaver,
    wherein a number of rows in the code block equals a modulation order of the block interleaver, and
    wherein a number of columns in the block interleaver equals either a result of dividing a codeword length of codewords in the code block by the modulation order, in an event that the codeword length is an integer multiple of the modulation order, or a smallest integer greater than the result of dividing the codeword length by the modulation order, in an event that the codeword length is not an integer multiple of the modulation order.

2. The method of claim 1, wherein the encoding of the data comprises:
    mapping modulation bits in the stream of interleaved data outputted by the bit-level interleaver with higher reliability to locations of LDPC bits in the base matrix of the LDPC code with higher column weights; and
    mapping modulation bits in the stream of interleaved data with lower reliability to locations of LDPC bits in the base matrix of the LDPC code with lower column weights.

3. The method of claim 2, wherein a first portion of the plurality of LDPC bits of the base matrix of the LDPC code comprise systematic bits, wherein a second portion of the plurality of LDPC bits of the base matrix of the LDPC code comprise information bits, wherein a third portion of the plurality of LDPC bits of the base matrix of the LDPC code comprise parity bits, and wherein the LDPC bits with higher column weights comprise systematic bits, information bits, or a combination thereof.

4. The method of claim 1, wherein a first portion of the plurality of bits of the base matrix of the LDPC code comprise systematic bits, wherein a second portion of the plurality of bits of the base matrix of the LDPC code comprise information bits, wherein a third portion of the plurality of bits of the base matrix of the LDPC code comprise parity bits, and wherein the encoding of the data comprises mapping modulation bits in the stream of interleaved data outputted by the bit-level interleaver with higher reliability to locations of the systematic bits first before mapping to locations of the parity bits.

5. The method of claim 1, wherein the block interleaver comprises a 256-quadrature amplitude modulation (QAM) interleaver, a 64-QAM interleaver, a 16-QAM interleaver or a 4-QAM interleaver.

6. The method of claim 5, wherein the block interleaver writes data row by row and reads the data column by column.

7. The method of claim 5, wherein bits in each column of the block interleaver forms a respective modulation symbol.

8. The method of claim 7, wherein first two bits in each modulation symbol are more reliable than other bits in the respective modulation symbol with gray coding.

9. The method of claim 5, wherein a first portion of the plurality of bits of the base matrix of the LDPC code comprise systematic bits, wherein a second portion of the plurality of bits of the base matrix of the LDPC code comprise information bits, wherein a third portion of the plurality of bits of the base matrix of the LDPC code comprise parity bits, and wherein the encoding of the data comprises filling systematic bits first in a first row of the code block used in the block interleaver and then in a second row of the code block used in the block interleaver.

10. An apparatus, comprising:
    a transceiver capable of wireless communications with at least one network node of a wireless network; and
    a processor coupled to the transceiver,
    wherein the processor is configured to encode data with a low-density parity-check (LDPC) code to provide encoded data, with the encoding involving interleaving, by a bit-level interleaver in the processor, the data to provide a stream of interleaved data,
    wherein the transceiver is configured to transmit the encoded data to the at least one network node of the wireless network,
    wherein, in encoding the data to provide the encoded data, the processor encodes the data to result in a code block in the encoded data being used in the bit-level interleaver;
    wherein a base matrix of the LDPC code comprises a plurality of LDPC bits arranged in a plurality of rows and a plurality of columns,
    wherein the bit-level interleaver comprises a block interleaver,
    wherein a number of rows in the code block equals a modulation order of the block interleaver, and
    wherein a number of columns in the block interleaver equals either a result of dividing a codeword length of codewords in the code block by the modulation order, in an event that the codeword length is an integer multiple of the modulation order, or a smallest integer greater than the result of dividing the codeword length by the modulation order, in an event that the codeword length is not an integer multiple of the modulation order.

11. The apparatus of claim 10, wherein, in encoding the data, the processor performs operations comprising:
    mapping modulation bits in the stream of interleaved data outputted by the bit-level interleaver with higher reliability to locations of LDPC bits in the base matrix of the LDPC code with higher column weights; and mapping modulation bits in the stream of interleaved data with lower reliability to locations of LDPC bits in the base matrix of the LDPC code with lower column weights.

12. The apparatus of claim 11, wherein a first portion of the plurality of LDPC bits of the base matrix of the LDPC code comprise systematic bits, wherein a second portion of the plurality of LDPC bits of the base matrix of the LDPC code comprise information bits, wherein a third portion of the plurality of LDPC bits of the base matrix of the LDPC code comprise parity bits, and wherein the LDPC bits with higher column weights comprise systematic bits, information bits, or a combination thereof.

13. The apparatus of claim 10, wherein a first portion of the plurality of bits of the base matrix of the LDPC code comprise systematic bits, wherein a second portion of the plurality of bits of the base matrix of the LDPC code comprise information bits, wherein a third portion of the plurality of bits of the base matrix of the LDPC code comprise parity bits, and wherein, in encoding the data, the processor maps modulation bits in the stream of interleaved data outputted by the bit-level interleaver with higher reliability to locations of the systematic bits first before mapping to locations of the parity bits.

14. The apparatus of claim 10, wherein the block interleaver comprises a 256-quadrature amplitude modulation (QAM) interleaver, a 64-QAM interleaver, a 16-QAM interleaver or a 4-QAM interleaver.

15. The apparatus of claim 14, wherein the block interleaver writes data row by row and reads the data column by column.

16. The apparatus of claim 14, wherein a first portion of the plurality of bits of the base matrix of the LDPC code comprise systematic bits, wherein a second portion of the plurality of bits of the base matrix of the LDPC code comprise information bits, wherein a third portion of the plurality of bits of the base matrix of the LDPC code comprise parity bits, and wherein bits in each column of the code block forms a respective modulation symbol, and wherein first two bits in each modulation symbol are more reliable than other bits in the respective modulation symbol with gray coding.

17. The apparatus of claim 14, wherein a first portion of the plurality of bits of the base matrix of the LDPC code comprise systematic bits, wherein a second portion of the plurality of bits of the base matrix of the LDPC code comprise information bits, wherein a third portion of the plurality of bits of the base matrix of the LDPC code comprise parity bits, and wherein, in encoding the data, the processor fills the systematic bits first in a first row of the code block used in the block interleaver and then in a second row of the code block used in the block interleaver.

* * * * *